United States Patent
Kawai

Patent Number: 6,131,074
Date of Patent: Oct. 10, 2000

[54] APPARATUS FOR CALIBRATING A PROGRAMMABLE COMPARATOR

[75] Inventor: Teruyoshi Kawai, Tokyo, Japan

[73] Assignee: Ando Electric Co., Ltd., Tokyo, Japan

[21] Appl. No.: 09/123,301

[22] Filed: Jul. 28, 1998

[30] Foreign Application Priority Data

Jul. 29, 1997 [JP] Japan .................................. 9-203611

[51] Int. Cl.[7] .......................... G01R 31/28; G01R 35/00; G01F 1/00

[52] U.S. Cl. .............................. 702/107; 702/87; 324/74; 324/121 R

[58] Field of Search ........................ 702/87, 107; 324/74, 324/121 R; 340/825.84, 825.22; 304/449

[56] References Cited

U.S. PATENT DOCUMENTS 5,184,062  2/1993  Ladwig ...................................... 324/74

FOREIGN PATENT DOCUMENTS 07183346  9/1992  Japan .............................. H01L 21/66
10232268  9/1992  Japan .............................. G01R 31/28

*Primary Examiner*—Kamini Shah
*Attorney, Agent, or Firm*—Fish & Richardson P.C.

[57] ABSTRACT

A calibration apparatus for a programmable comparator is provided which does not need circuits for offset adjustment and gain adjustment or high precision parts makes possible inexpensive construction of the apparatus itself, and at the same has a wide adjustment range and can carry out high precision calibration. The programmable comparator compares the analog voltage value corresponding to a supplied digital code and the voltage value corresponding to the electric current value of an electric current supplied by a predetermined power supply point, and outputs the result. In the calibration apparatus, the power supply means supplies to a power supply point an electric current having an electric current value indicated, and an electric current detection means converts the electric current value of the electric current flowing through the power supply point to a voltage value, and this value is output to the programmable comparator. The calculation means directs the power supply means to generate an electric current having for each supplied current value "0" or a predetermined electric current value other than "0", and calculates for each supplied current value the actually measured digital code so that the result of the comparison output from the programmable comparator matches. In addition, the calculation means calculates the code correction data from the ideal characteristics between the supplied current value and the digital code, and each supplied current value and each actually measured digital code corresponding to them. According to this, the correction means corrects the digital code supplied to the programmable comparator based on the calculated code correction data.

12 Claims, 4 Drawing Sheets

APPARATUS FOR CALIBRATING A PROGRAMMABLE COMPARATOR

BACKGROUND OF THE INVENTION

1. Field of the Invention

The present invention relates to a calibration apparatus for a programmable comparator used in an IC (integrated circuit) tester which compares the electric current value (or electric voltage value) measured at an electric source pin of an IC and an arbitrary desired electric current value (or electric voltage value). This application is based on patent application, No. Hei 9-203611, filed in Japan, the content of which is incorporated herein by reference.

2. Description of the Related Art

An example of an IC tester is one that supplies an electrical source current or electrical source voltage from the IC tester to a power source pin of the IC which is the device under test. In this situation, for example, the electric current value actually supplied to the power source pin of the IC is one important parameter showing the characteristics of the IC as an electric current consumption. Therefore, in an IC tester, it is necessary to be able to test whether or not the electric current consumption of the IC is the expected value. In order to obtain this object, a programmable comparator for comparing the electric current value (or electric voltage value) measured, for example, at an IC power source pin, and an expected electric current value (or electric voltage value) is used. In addition, in this type of programmable comparator, as with any other type of measuring instruments and apparatus, and it is necessary that periodic calibration is carried out and it be able to make very precise comparisons of electric current values and electric voltage values at all times.

FIG. 4 is a block diagram showing the circuit structure of a calibration apparatus of a programmable comparator according to the related technology. As shown in the figure, this circuit can be roughly divided into the following function blocks: test controller 1, I/O (input/output) control circuit 2, power supply circuit 3, a current voltage conversion circuit 4, and a programmable comparator 5.

The test controller 1 directs the power supply circuit 3 via an I/O control circuit 2 to generate the desired electric current value. The test controller 1 may, for example, send an arbitrary digital code to a programmable comparator 5, compare the electric current value corresponding to this digital code to the electric current value the power supply circuit 3 supplies to the power supply point Ps using the current voltage conversion circuit 4 and the programmable comparators 5, and retrieve from the programmable comparators 5 the obtained result of the comparison. The detailed function of the test controller 1 will be explained further below.

The I/O control circuit 2 is a bidirectional buffer for transferring various data between the test controller 1, the power supply circuit 3, and the programmable comparator 5.

The power supply circuit 3 can supply an electric current having an electric current value range from the highest positive supplied current to the highest negative supplied current, and supplies to the power supply point Ps corresponding to the power supply pins of an IC, etc,. a current having an electric current value indicated by the test controller 1. As shown in the figure, this power supply circuit 3 comprises a voltage generator 3a, an output resistor 3b, a force amplifier 3c, a buffer 3d, a feedback resistor 3e, and a sense amplifier 3f. The voltage generator 3a outputs a voltage depending on the digital code sent from the test controller 1 via the I/O control circuit 2, and comprises DACs (digital/analog converters), etc. In addition, the output resistor 3b, and force amplifier 3c, and the feedback resistor 3e form a negative feedback amplifier. The output resistor 3b and the feedback resistor 3e are resistors for determining the gain of the negative feedback amplifier, and the force amplifier 3c is an operational amplifier which is a basic structural component of the negative feedback amplifier. In addition, the buffer 3d is a current amplification circuit, and is necessary because the force amplifier 3c cannot supply the output current required by the power supply circuit 3 by itself. The sense amplifier 3f is a voltage follower amplifier inserted in order to feed accurately the voltage in the power supply point Ps back to the negative feedback amplifier. That is, the power supply circuit 3 must accurately feed the voltage in the power supply point Ps back to the negative feedback amplifier because it is necessary to supply accurately a set voltage to the power supply point Ps. However, an accurate voltage is not fed back because electric current has flowed to the feedback path of the negative feedback amplifier, and thus a voltage follower amplifier having a high input impedance is inserted into the feedback path.

The current voltage conversion circuit 4 comprises an electric current detection resistor 4a for converting the electric current value supplied to the power supply point Ps to a voltage value, and a voltage detection amplifier 4b which amplifies a voltage value generated at both ends of this electric current detection resistor 4a and outputs it to the programmable comparator 5.

An electric current supplied by the power supply circuit 3 to the power supply point Ps is converted to a voltage value using the current voltage conversion circuit 4, and the programmable comparator 5 compares this voltage value and the voltage value which is a digital code supplied from the test controller 1 via the I/O control circuit 2 and converted into an analog voltage, and outputs the obtained result of the comparison from terminal Tc to the test controller 1. That is, by arbitrarily varying the digital code supplied from the test controller 1 to the programmable comparator 5, an arbitrary current value is compared with the current value that the power supply circuit 3 supplies to the power supply point Ps, and the size relationship between these electric current values can be detected. Moreover, this digital code is a signed binary that takes a positive or negative value, and more specifically, in the power supply circuit 3 can supply "largest negative supplied current"~"largest positive supplied current" corresponding to the range of "−FULL" code data~"+FULL" code data.

In this programmable comparator 5, register 5a stores the digital code sent from the test controller 1. The DAC 5b converts to the analog voltage the digital code stored in register 5a. The DAC 5b has installed a gain adjustment terminal Tg and an offset adjustment terminal To for correcting the gain and offset in the conversion process, and the gain correction and offset correction are carried out depending on the analog voltage value sent to each of these terminals. Register 5c stores the digital code for gain adjustment sent to the gain adjustment DAC 5d from the test controller 1, and the gain adjustment DAC 5d converts the digital code into an analog voltage, which is sent to the gain adjustment terminal Tg of the DAC 5b. Similarly, register 5e stores the digital code for the offset adjustment sent to the offset adjustment DAC 5f from the test controller 1, and the offset adjustment DAC 5f converts this digital code into an analog voltage, and sends it to the offset adjustment terminal To of the DAC 5b. Moreover, the voltage generator 3a, the register 5a, the register 5c, and the register 5e are structured so that one among them is selected by an the address signal (selection signal) AD sent from the test controller 1. In addition, as explained above, while in the power supply circuit 3 the digital code from the test controller 1 for indicating the electric current value is set, the various digital codes are also set for each of the above-described registers. Next, the comparator 5g is provided with a terminal Tin1 into which the output voltage value of DAC 5b is input, and a terminal Tin2 into which the voltage value that the current voltage conversion circuit 4 detects is input. This comparator 5g compares the voltage values between both terminals, and outputs to the above-mentioned terminal Tc their size relationship. In addition, a variable resistor $5_h$ is connected to the comparator $5_g$ in order to compensate the offset that it produces itself.

The calibration of the programmable comparator 5 using the above-described circuit construction is carried out as follows. First, in order to carry out offset adjustment of the DAC 5b, the test controller 1 writes the lowest value of the digital code, the "−FULL" code data, to register 5a, and outputs this to the DAC 5b. Next, the test controller 1 writes the digital code of the offset adjustment to register 5e, applies this to the offset adjustment DAC 5f, and sends the voltage value corresponding to the written digital data to the offset adjustment terminal To of the DAC 5b. Additionally, the test controller 1 corrects the offset by adjusting the digital code written to register 5e so that the voltage value in the terminal Tin1 of the comparator $5_g$ becomes the "largest negative voltage" of the output amplitude of the DAC 5b.

Next, in order to carry out gain adjustment of the DAC 5b, the test controller 1 writes the highest value of the digital code, the "+FULL" code data, to the register 5a, and outputs this to the DAC 5b. Next, the test controller 1 writes the digital code of the gain adjustment to the register 5c, outputs this to the gain adjustment DAC 5d, and sends the voltage value corresponding to the written digital code to the gain adjustment terminal Tg of the DAC 5b. Additionally, the test controller 1 corrects the gain by adjusting the written digital code written in register 5c so that the voltage value in the terminal Tin1 of the comparator $5_g$ becomes the "largest positive voltage" of the output amplitude of the DAC 5b.

In addition to the above, the test controller 1 sends in advance to DAC 5b the digital code setting to zero the voltage input into the terminal Tin1 of the comparator 5g, and when the voltage value of the voltage sent to terminal Tin2 crosses "0", and varies slightly, the resistance value of the variable resistor 5h is adjusted so that in both terminals the size relationship of the voltage values sent from the comparator 5g is reversed. In this manner, the offset adjustment of comparator 5g is carried out.

Thus, in the above-described calibration apparatus of the programmable; comparator, the DACs and registers for the respective offset and gain are necessary in order to adjust the offset and gain of the DAC 5b. In addition, in order to adjust the offset of the comparator 5g, a variable resistor 5h for the offset adjustment is necessary. For these reasons, in addition to the circuit structure of the calibration apparatus being complicated, there is the problem that the apparatus itself becomes large. In addition, as described above, because the digital code sent to the programmable comparator 5 is either "+FULL" code data or "−FULL" code data, there is also the problem that even when offset adjustment and gain adjustment are carried out, the correction is not very precise. Furthermore, in the circuit structure shown in the figure, when the current voltage conversion circuit 4 converts the electric current flowing to the electric current detection resistor 4a to voltage, the conversion error produces and appears as this kind of output error of the comparator 5g. Therefore, in order to decrease the output error of this kind of comparator 5g, it is necessary to use high precision parts for each part forming the current voltage conversion circuit 4, and this has the drawback that these parts alone make the apparatus become expensive.

SUMMARY OF THE INVENTION

Therefore, the object of the present invention is to present a calibration apparatus for a programmable comparator which does not require circuits for offset adjustment and gain adjustment or high precision parts, which makes possible an inexpensive construction of the apparatus itself, and which can carry out calibration within a wide adjustment range and with high precision.

In order to achieve the above-described object, in the present invention, a power supply means supplies to a power supply point an electric current having an electric current value the power supply means designates, and a electric current detection means converts the electric current value of the current flowing through the power supply point to a voltage value, which is output to programmable comparator. By instructing the power supply means, a calculating means by generates an electric current each having a supplied current value of "0" or a pre-determined electric current value other than "0", and calculates for each supplied current value the actually measured digital code so that the result of comparison output from the programmable comparator shows agreement. Additionally, the calculation means calculates code correction data from the ideal characteristics between the supplied electric current value and the digital code, and each supplied current value and the actually measured digital code corresponding to them. According to this, the correction means corrects the digital code supplied to the programmable comparator based on calculated code correction data.

In this manner, the offset adjustment circuit and the gain adjustment circuit necessary in the conventional programmable comparator are all unnecessary, and in addition there is no need to construct the electric current detection means with high precision parts. Because of this, the apparatus itself, including the programmable comparator, can be fabricated inexpensively and miniaturized.

DETAILED EXPLANATION OF THE PREFERRED EMBODIMENTS

Figure 1:
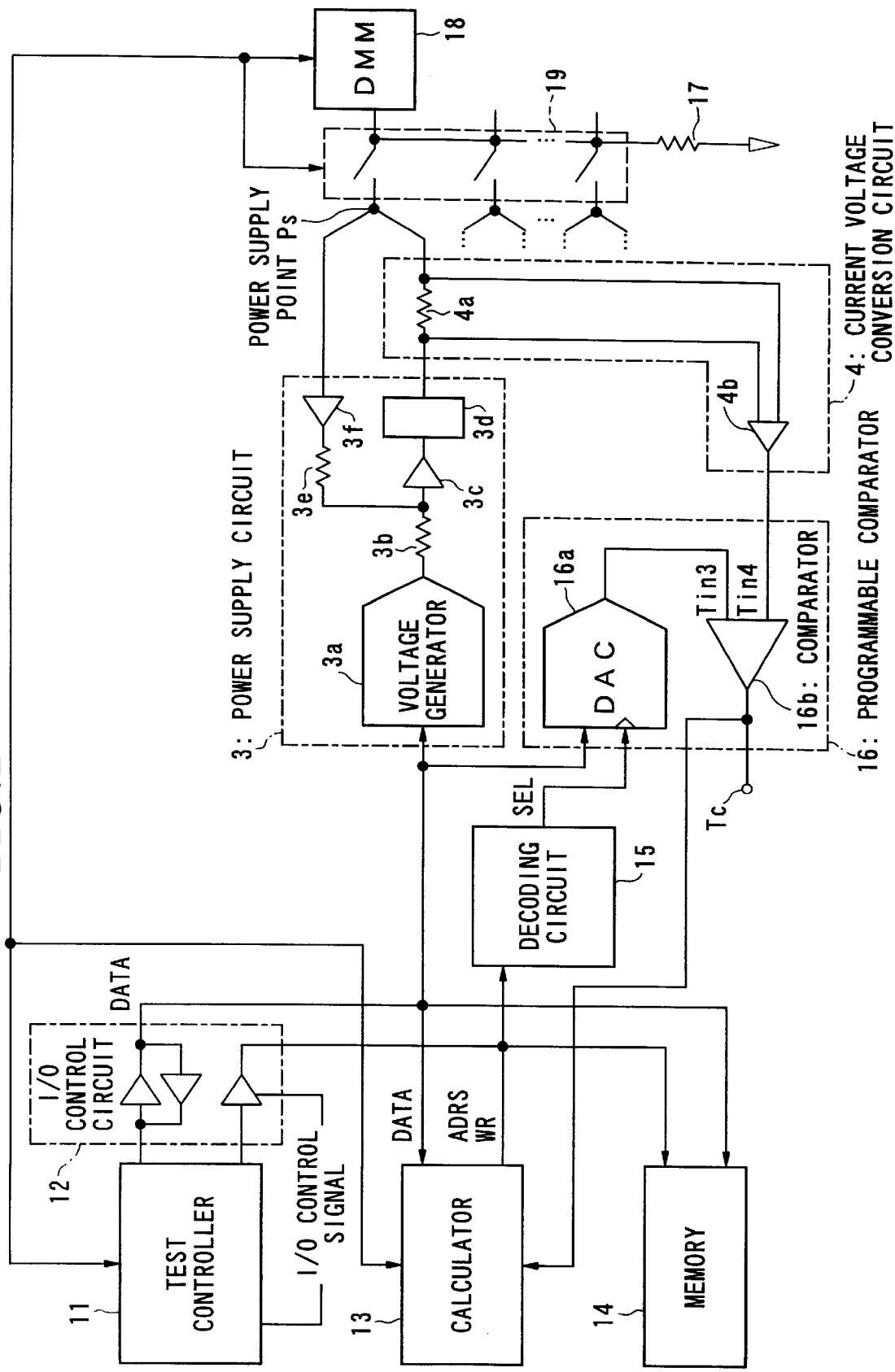
FIG. 1 is a block diagram showing a circuit structure of a calibration apparatus of a programmable comparator of an embodiment of the present invention.
Figure 4:
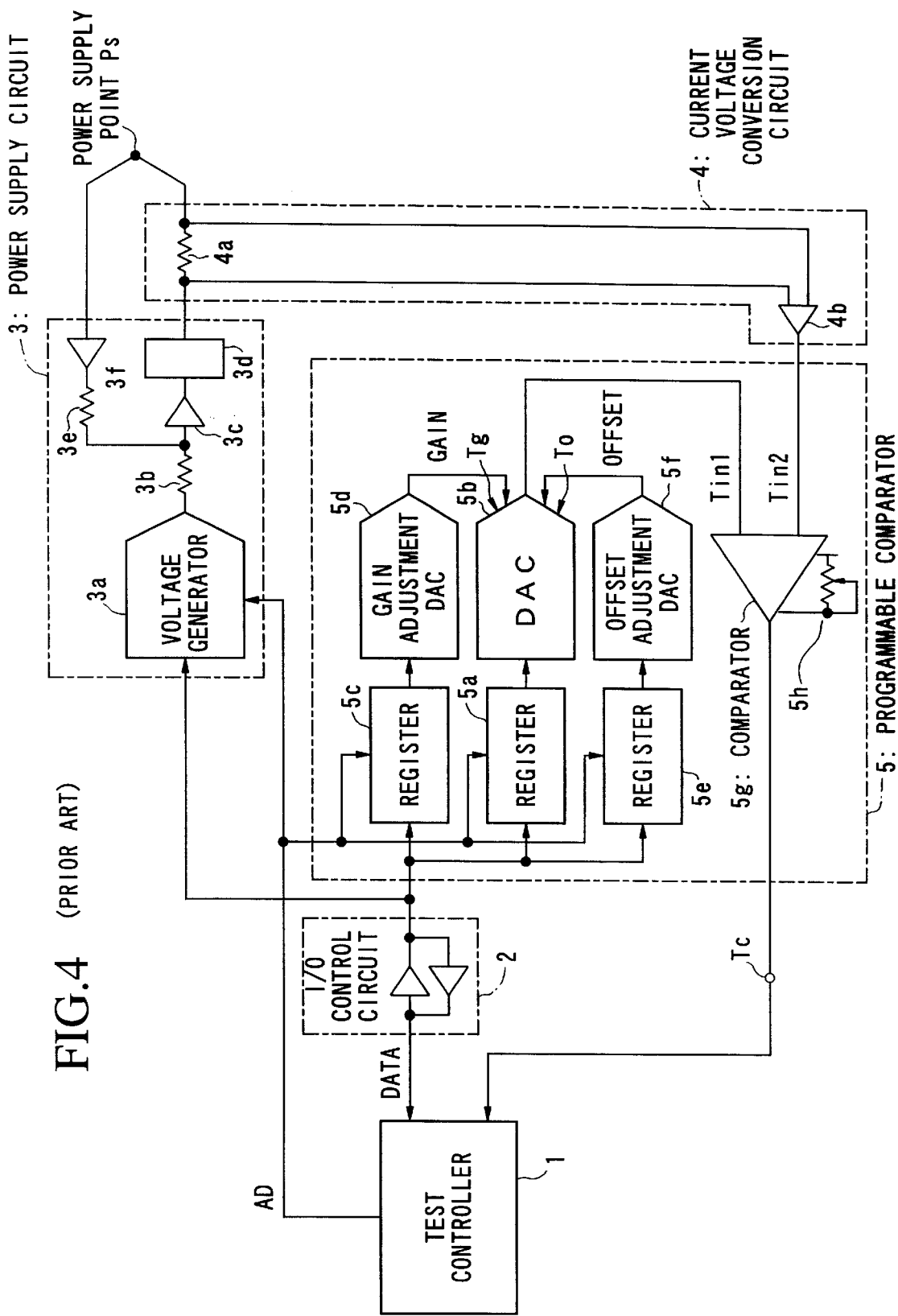
FIG. 4 is a block diagram of the circuit structure of a calibration apparatus of a programmable comparator of the related technology.

Below, the embodiments of the present invention will be explained referring to the figures. FIG. 1 is a block diagram showing a circuit structure of a calibration apparatus of a programmable comparator of the present embodiment. In this figure, the same reference numeral denotes the construction elements having the same function so those shown in FIG. 4, and their explanation is omitted. Further, the power supply circuit 3, the current voltage conversion circuit 4, and the programmable comparator 16 described below are actually each constructed according to the number of power supply pins, etc., of the IC which is the test object, but in order to avoid complication, these are shown in the figures as having one each.

The test controller 11 outputs via the I/O control circuit 12 various control signals (that is, address ADRS and write signal WR) to the power supply circuit 3, the calculator 13, the memory 14, the decoding circuit 15, the programmable comparator 16, and the DMM 18, communicates with each of these components via the data bus DATA, and in this manner, obtains each type of data necessary in calibration by controlling each of these parts. The I/O control circuit 12, in addition to the function of having I/O control circuit 2 shown in FIG. 4, outputs to each of the above parts the above-mentioned address ADRS and write signal WR by a timing which the I/O control signal sent from the test controller 11. determines. In addition, the calculator 13 carries out each type of calculation processing based on the control signal sent from the test controller 11 and information stored in the memory 14. Moreover, the details of the functions that the test controller 11 and the calculator 13 have are clarified in the explanation of the operation.

The memory 14 stores each type of data necessary for calibration sent from the test controller 11, the calculation results of the calculations carried out by the calculator 13, and in addition, the flags showing whether or not the calculator 13 is making calculations.

The decoding circuit 15 outputs a control signal SEL according to the address ADRS and the write signal WR output from the test controller 11. This control signal SEL indicates whether or not to write a digital code for one among the plurality of programmable comparators 16, ... 16 which exist on each power source pin of an IC. In other words, the control signal SEL can be said to indicate whether or not any programmable comparator will be activated. Moreover, depending on the control signal SEL selecting each programmable comparator 16, the power supply circuit 3 and the current voltage conversion circuit 4 in the set of the selected programmable comparator 16 are also selected. As can be understood from the above, the address ADRS is a signal for selecting the power source pin of a IC which is the object of calibration and the programmable comparator 16 which corresponds to this electric source pin, and the write signal WR is a signal for determining the timing when writing a digital code for the selected programmable comparator 16.

The programmable comparator 16, as shown in the figure, comprises DAC 16a and comparator 16b. The function of programmable comparator 16 are similar to those of the programmable comparator 5 shown in FIG. 4, but the DAC 16a does not have installed a gain or offset adjustment function, and differs from it in that the comparator 16b does not have an offset adjustment function. The DAC 16a converts the digital code sent from the test controller 11 or the calculator 13 to analog voltage when the DAC 16a itself has been selected by the control signal SEL sent from the decoding circuit 15. In addition, the comparator 16b compares the voltage value of the terminal Tin3 provided by the output voltage of the DAC 16a and the voltage value of the terminal Tin4 provided by the output voltage of the current voltage conversion circuit 4, and outputs to the terminal Tc and the calculator 13 a signal indicating their size relationship.

A resistor 17 connected to the output terminal of the power supply circuit 3 via the switching circuit 19 described below is provided in order to detect electric current flowing to the power supply point Ps. In contrast, the digital multimeter 18 (below, abbreviated "DMM") provides a capacity to measure respectively the voltage, current, and resistance of the measured object, and besides measuring the resistance value of the resistor 17, it also measures the terminal voltage of resistor 17, and the results of these measurements are sent to the test controller 11 and the calculator 13. Moreover, in the present embodiment, a current measuring function of the DMM 18 is not used.

In addition, the switching circuit 19, directed by the test controller 11, selects one among the power supply points Ps, Ps, ... , Ps provided depending on the number of power source pins, etc., of the IC which is the test object, and connects the selected power supply point Ps, the resistor 17, and the DMM 18.

Figure 2:
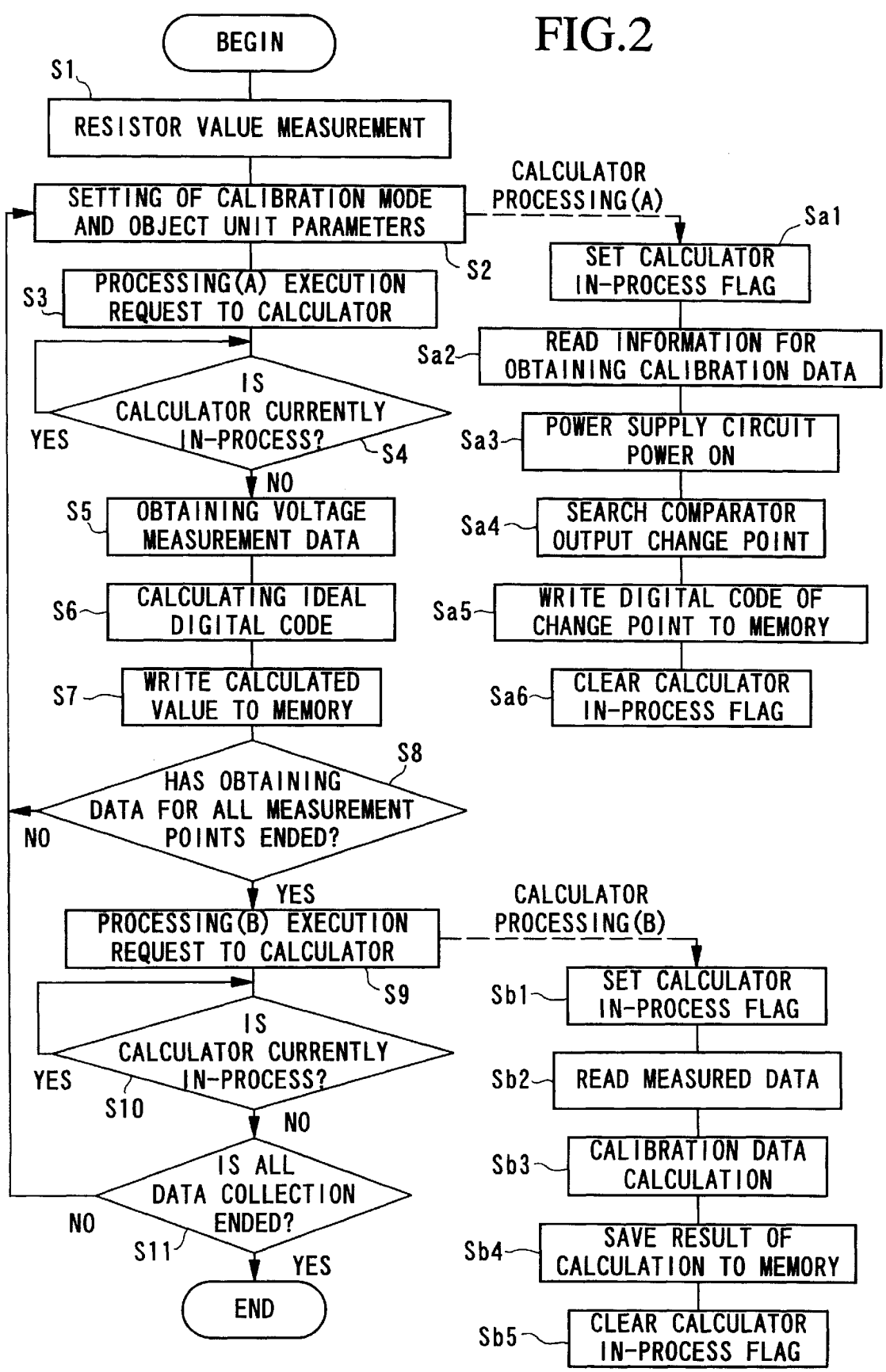
FIG. 2 is a flow chart showing the sequence of the calibration in the same embodiment.

Next, referring to the flow chart in FIG. 2, the calibration sequence of a programmable comparator with the above-described structure is explained. First, the user indicates to the test controller 11 which among the plurality of existing programmable comparators 16 is to be calibrated. At this time, the user can simultaneously indicate as the object of calibration a part or all of the plurality of programmable comparators 16. Subsequently, when the user directs the calibration instructions for the indicated programmable comparator 16 to the test controller 11, the test controller 11 first executes data acquisition processing necessary for the calibration. That is, in step S 1, the test controller 11 tells the DMM 18 to measure the resistance value of resistor 17, and the resistance value measured by the DMM 18 is read from DMM 18, and stored in the memory 14.

Next, in step S 2, the test controller 11 selects one among the programmable comparators 16 indicated as objects of calibration, and writes into the memory 14 the parameter setting data comprising the address ADRS assigned to the relevant programmable comparator 16 and the electric current value which the power supply circuit 3 should supply. At this time, the above address ADRS is sent to the decoding circuit 15 as well, and later, at the point in time the write signal WR is sent from the test controller 11, the decoding circuit 15 sends the control signal SEL to the programmable comparator 16 indicated by the address ADRS. Furthermore, the test controller 11 connects power supply point Ps corresponding to the selected programmable comparator 16 with the resistor 17 and the DMM 18 by controlling the switching circuit 19.

Here, in the present embodiment, the electric current value supplied from the power supply circuit 3 to the power supply point Ps takes one of the three values "largest positive supplied current", "0", or "largest negative supplied current", and by obtaining various necessary data (described below in detail) concerning each of these electric current values, calibration is carried out. The test controller 11 sequentially writes in memory 14 these three electric current values as the supplied electric current value output from the power supply circuit 3, and carries out data acquisition processing for each electric current setting value. That is, in the present embodiment, in total data acquisition processing is carried out three times.

Next, in step S 3, the test controller 11 directs the execution of the "correct data acquisition command", gives instructions to execute of the relevant commands, and proceeds automatically to the calculator processing sequence. By this calculator processing sequence, the test controller 11 and the calculator 13 are in a condition where they can run together in parallel. At this point, the calculator 13 proceeds to the processing of step S a1, and sets the "calculator in-process flag" provided beforehand in the memory 14. At this time, the test controller 11 periodically reads the calculator in-process flag from the memory 14, and confirms that the relevant flag has been set by the calculator 13. Additionally, subsequently in step S 4 the test controller 11 periodically reads the calculator in-process flag, and keeping track of its value, waits until the calculation of the calculator 13 has finished and the relevant flag is cleared.

In step S a2, the calculator 13 sequentially reads and inputs the parameter setting data the test controller 11 has written to the memory 14 in step S2. Next, in step S a3, the calculator 13 begins operation of the power supply circuit 3 based on the input parameter setting data, and at the same time directs the power supply circuit 3 to generate the indicated electric current value. Furthermore, the electric current value first generated is the "largest positive supplied current value", and next, the electric current values "0" and "largest negative supplied current value" are generated in sequence.

Here, among these three supplied electric current values, when the electric current with the electric current value "0" is supplied to the power supply point Ps from the power supply circuit 3, while measuring the terminal voltage of the resistor 17 using the voltage measuring function of the DMM 18, the calculator 13 suitably alters the digital code sent to the power supply circuit 3 so that the relevant voltage value becomes "0 volts". In contrast, when the electric current having the "largest positive supplied current value" or the "largest negative supplied current value" is supplied to the power supply point Ps from the power supply circuit 3, the calculator 13 calculates the digital code which generates the electric voltage values at power supply point Ps corresponding to each supplied electric current value based on the supply electric current value to which they should be set and the resistance value of the resistor 17, and sends the result to the power supply circuit 3. That is, in these cases, it is desirable that the digital code sent to the power supply circuit 3 be adjusted, but this is not always a necessary procedure.

As stated above, when an electric current with an electric current value of "0" is supplied, because the digital code sent to the power supply circuit 3 is directly used in the correction calculation described below, the digital code is adjusted so that the voltage value of the power supply point Ps measured by the DMM 18 correctly becomes "0 volts". By doing this, it is possible to find more precisely the offset correction data and the gain correction data, allowing an even more precise calibration.

In contrast, when an electric current with the "largest positive supplied current value" or the "largest negative supplied current value" is supplied, if the electric current value the power supply circuit 3 actually supplies and the digital code sent to the DAC 16a at that time are known, the correction calculation described below is not hindered. Therefore, in these cases, due to the error caused by the power supply circuit 3 and the resistor 17, it does not matter if the "largest positive supplied current value" or the "largest negative supplied current value" are set to the inexact value, and there is no problem if the supplied current value is set to an approximate value.

Next, in step S a4, the calculator 13 sends the digital code corresponding to one of the above-described supplied current values to the DAC 16a. At this time, the calculator 13 generates a write signal WR, and sets the digital code in the DAC 16a by sending the control signal SEL to the selected programmable comparator 16. By doing this, the DAC 16a converts the sent digital code to an analog voltage, and sends this to the terminal Tin3 of the comparator 16b. At this time, the current voltage conversion circuit 4 detects the voltage value corresponding to the electric current value of the electric current flowing through the power supply point Ps, and supplies it to the terminal Tin4 of the comparator 16b. In this manner, the comparator 16b outputs the result of comparison of both voltage values sent to the terminal Tin3 and terminal Tin4 to the terminal Tc. Then, the calculator 13 inputs the result of the comparison of the comparator 16b, and stores it in the memory 14.

Next, the calculator 13, while changing the digital code sent to the DAC 16a in the neighborhood of the digital code set in the DAC 16a, in the same manner as described above, the output of the comparator 16b is retrieved in sequence. After this, the calculator 13 examines the digital code of the boundary (that is, the actually measured digital code) where the size relationship of the voltage value of the terminal Tin3 and terminal Tin4 reverse based on the result of a plurality of comparisons retrieved from the comparator 16b, and next, in step S a5, writes the examined digital code to the memory 14. That is, depending on the electric current value supplied from the power supply circuit 3, the calculator 13 searches within the code sent to the DAC 16a for the digital code in which the voltage value that the current voltage conversion circuit 4 detected and the output voltage value of the DAC 16a are roughly the same.

In the above manner, because the calculator 13 has completed the processing (the calculator processing (A) shown in FIG. 2) as instructed by the test controller 11, in step S a6 the calculator 13 clears the calculator in-process flag stored in the memory 14, and subsequently waits for the next command to be sent from the test controller 11.

On the other hand, when the calculator in-process flag is cleared, the test controller 11 confirms that the processing of the calculator 13 has completed (the result of the determination of step S 4 is "NO"). Then, in step S 5, after instructing the DDM 18 to measure of the terminal voltage of the resistor 17, the test controller 11 retrieves the results of this measurement from the DMM 18, and stores it in the memory 14. Next, the test controller 11 calculates the electric current value of the current value supplied from the power supply circuit 3 by Ohm's Law from the resistance value of the resistor 17 measured in step S 1 and the terminal voltage of the resistor 17 just received.

Next, in step S 6, when each of the characteristics of the power supply circuit 3, the current voltage conversion circuit 4, and the programmable comparator 16 are ideal, the test controller 11 calculates a digital code so that the result of the determination of the size relationship output from the comparator 16b is reversed based on the supplied current value calculated in step S5. That is, when each of these parts is ideal, the relationship ("ideal characteristics") between the digital code sent to the DAC 16a and the supplied current value of the power supply circuit 3 are predetermined. In these ideal characteristics, the "largest positive supplied current value" corresponds to "+FULL" code data, "−FULL" code data corresponds to the "largest negative supplied current value", and "0" digital code corresponds to the electric current value "0", and the supplied current value and the digital code data have a proportional relationship (see the dashed line Q in FIG. 3, explained below). Therefore, the digital code in the ideal state can be found from the constant of proportionality between the supplied current value and the digital code data, and the supplied electric current value.

Additionally, in step S 7, the test controller 11 uses the calculated digital code as ideal digital code, and inputs this and the supplied current value to memory 14. For example, because the power supply circuit 3 is instructed to generate the "largest positive supplied current value", in this case, the "+FULL" code data corresponding to the "largest positive supplied current value" is stored in memory 14 as the ideal digital code.

Next, in step S 8, the test controller 11 determines whether or not the necessary data has been obtained for all measurement points (that is, the electric current values that should be measured) related to the programmable comparator 16 which is the present object. In the above manner, the electric current values necessary for calibration are the three points of the "largest positive supplied current", "0", and the "largest negative supplied current", so if the data acquisition processing related to all supplied current values is not yet completed, the test controller 11 returns the processing to step S 2 after changing the supplied current value to the next current value, and carries out for each supplied electric current value the above-described steps S 2~S 7, and steps S a1~S a6 by calculator 13.

Additionally, when all processing of steps S 2~S 7 for all supplied electric current values has taken place, the result of the determination of step S 8 becomes "YES". Then, in step S 9, the test controller 11 issues a "calibration data calculation command" to the calculator 13, automatically moves to the calculation processing sequence, and test controller 11 and calculator 13 again operate in parallel.

Here, the calculator 13 proceeds to step S b1 and sets the calculator in-process flag in memory 14, and at the same time, after confirming that the calculator in-process flag has been set, the test controller 11 waits at step 10 until the calculator in-process step has been cleared by the calculator 13.

Next, the calculator 13 moves the processing to the step S b2, and respectively reads the ideal digital code and the supplied current value corresponding to it that the test controller 11 wrote to the memory 14 in step S 7, and the actually measured digital code that the calculator 13 itself wrote to the memory 14 in step S a5. Next, after calculating the "offset digital code" and the "gain correction" in step S b3 according to the procedures described in detail below, in the next step S b4 the calculator 13 writes the result of these calculations into the memory 14. In this manner, the processing requested by the test controller 11 (the calculator processing (B) shown in FIG. 2) is completed, and the calculator 13 clears the calculator in-process flag in step S b5 and waits until the next command is issued from the test controller 11.

Figure 3:
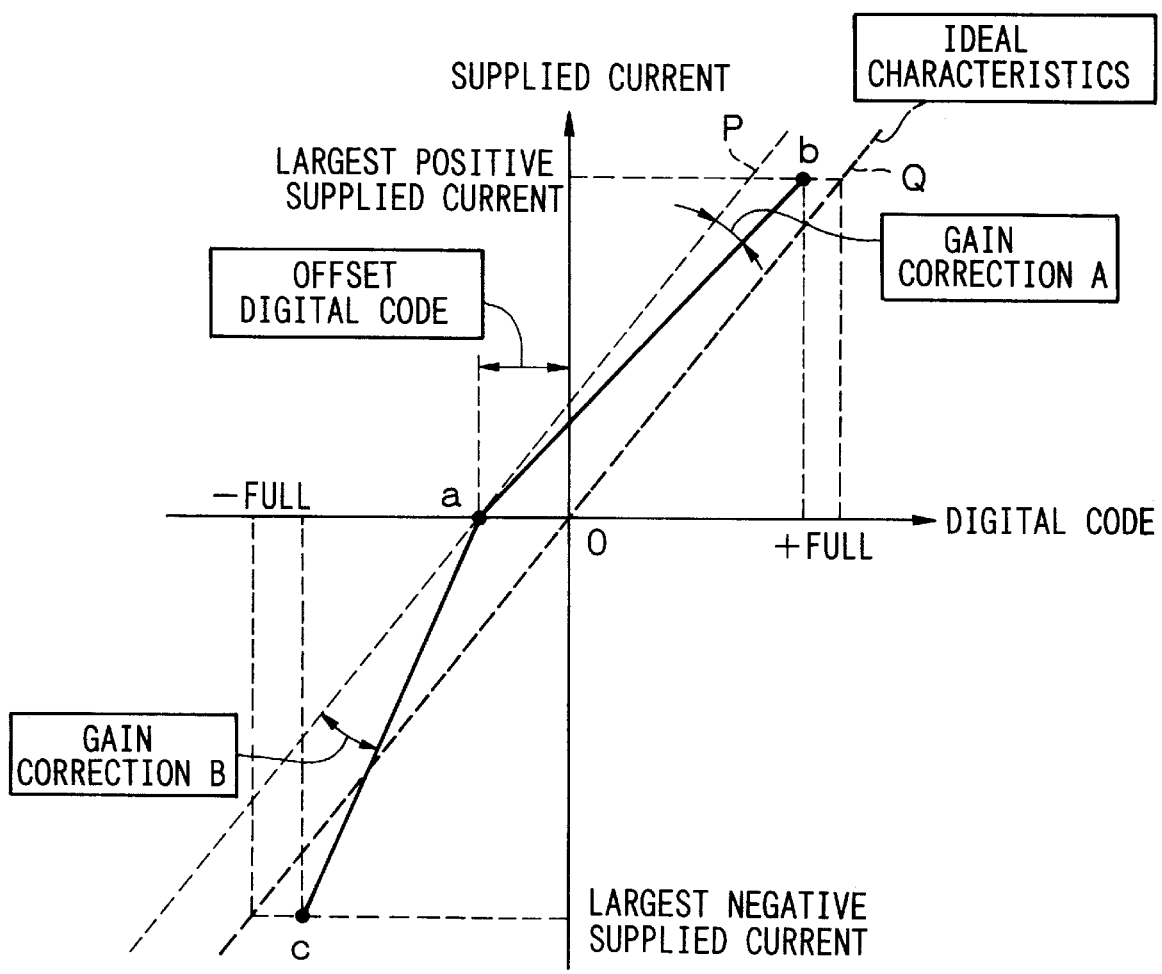
FIG. 3 is a graph showing the relationship between the supplied current of the power supply circuit 3 and the digital code sent to the DAC 16a in the same embodiment.

Here, the calculation procedure for the offset digital code and the gain correction carried out by the calculator 13 is explained. FIG. 3 is a graph showing the relationship between the supplied current value the power supply circuit 3 supplies to the power supply point Ps and the digital code sent to the DAC 16a. In this figure, the offset digital code and the gain correction related to DAC 16a are shown together.

In the figure, point "a" corresponds to the case wherein the electric current with an electric current value of "OO" is actually supplied from the power supply circuit 3. Here, when the voltage value corresponding to the supplied current value "0" is sent to the comparator 16b, the digital code of point "a" sent to the DAC 16a becomes the boundary of the digital code causing the result of the output of this comparator 16b to reverse. In the same way, point "b" shows the case wherein the supplied electric current of the power supply circuit 3 is the "largest positive supplied current", and point "c" shows the case wherein the supplied current of the power supply circuit 3 is the "largest negative supplied current".

In contrast, the dashed line Q is the ideal characteristics showing the relation between the supplied current value of the power supply circuit 3 and the digital code which should be set to the DAC 16a when it is assumed that any of the power supply circuit 3, the current voltage conversion circuit 4, or the programmable comparators 16 have ideal characteristics. That is, as described above, the digital code in the case that "largest positive supplied current value", "0", or "largest negative supplied current value" becomes, respectively, "+FULL", "0", and "−FULL". In addition, the dashed line P shows a straight line having the slope of the ideal characteristics shown by the dashed line Q and passing through point "a". Furthermore, the "gain correction A" indicates the difference in slope between the straight line ab, which connects point "a" and point "b", and the straight line P, which is parallel to dashed line Q. Additionally, the "gain correction B" indicates the difference in slope between the straight line ac which connects point "a" and point "c" and the straight line P.

In addition, the calculator 13, based on the digital code of each point "a", "b", and "c" shown in FIG. 3 and the supplied current value, and the ideal digital code related to the "largest positive supplied current", the offset digital code, gain correction A, and gain correction B necessary for calibration are respectively calculated as shown below.

First, when the supplied current of the power supply circuit 3 is "0", the digital code of point "a" is the border of the digital code at which the result of the output of the comparator 16b is reversed. Therefore, the digital code at this point "a" becomes as-is the offset digital code.

Next, in finding the gain correction A and gain correction B, first the slope of the ideal characteristics (dashed line Q) is calculated with equation 1. Further, the "slope" shown in each equation below is defined by exchanging the numerator and denominator in the usual sense of "slope".

$$\text{slope of ideal characteristics} = \frac{\text{ideal digital code in the largest positive supplied current}}{\text{largest positive supplied value}} \quad (1)$$

Next, the slope of the straight line connecting point "a" and point "b" is found with equation 2:

$$\text{slope of straight line } ab = \frac{\text{digital code of point ``b'' } - \text{digital code of point ``a''}}{\text{supplied current value of point ``b''}} \quad (2)$$

The gain correction A is found from these equations 1 and 2 by equation 3:

$$\text{gain correction } A = \frac{\text{slope of straight line } ab}{\text{slope of ideal characteristics}} \quad (3)$$

-continued $$= \frac{\text{digital code of point ``}b\text{''} - \text{digital code of point ``}a\text{''}}{\text{supplied current value of point ``}b\text{''}}$$
$$\frac{}{\text{the ideal digital code of the largest positive supplied current}}$$
$$\overline{\text{largest positive supplied value}}$$

Next, the slope of the straight line connecting point "a" and point "c" is found with equation 4:

$$\text{slope of straight line } ac = \frac{\text{digital code of point ``}a\text{''} - \text{digital code of point ``}c\text{''}}{\text{supplied current value of point ``}c\text{''}} \quad (4)$$

In addition, the gain correction B is found from equations 1 and 4 by equation 5:

$$\text{gain correction } B = \frac{\text{slope of straight line } ac}{\text{slope of ideal characteristics}} \quad (5)$$

$$= \frac{\dfrac{\text{digital code of point ``}a\text{''} - \text{digital code of point ``}c\text{''}}{\text{supplied current value of point ``}c\text{''}}}{\dfrac{\text{ideal digital code of the largest positive supplied current}}{\text{largest positive supplied current value}}}$$

In the above manner, when the calculator 13 finished the processing related to the "calibration data calculation command", it clears the calculator in-process flag in step S b5. When the processing of this step S b5 ends and the test controller 11 confirms that the processing of the calculator 13 has ended in step S 10 (the determination result "NO"), at that time, the calibration of the programmable comparator 16 which is the object is complete. Then, in step 11, the test controller 11 determines whether or not the calibrations have been carried out for all programmable comparators indicated by the user. Here, if programmable comparators 16 which should be calibrated still remain, (the result of the determination of step S 11 is "NO"), the test controller 11 changes to the next programmable comparator 16 which is an object, returns to the processing in step S 2, and repeats the processing of the above-described steps S 2 through S 10, steps S a1~S a6 and steps S b1~S b5 in the calculator 13.

In this manner, calibration for all programmable comparators which are objects is completed, and subsequently, when actually at the stage in which the IC is tested, the test controller 11 verifies the electric current value supplied to the power supply pin of the IC from the power supply circuit 3. Here, the test controller 11 calculates the digital code (ideal digital code) of the ideal characteristics corresponding to the electric current value expected as the current consumption of the tested IC from the slope of the ideal characteristics shown in Eq. 1. Next, the test controller 11 sends the calculated ideal digital code to the calculator 13, and instructs it to correct the ideal digital code. In this manner, the calculator 13 carries out correction calculations of the ideal digital code sent from the test controller 11 using the offset digital code, gain correction A, and gain correction B stored in the memory 14, and returns the result of this calculation to the test controller 11. The test controller 11 chooses one of the programmable comparators 16 using the address ADRS, outputs a write signal WR, and supplies the corrected digital code sent from the calculator 13 to the DAC 16a in the selected programmable comparator 16.

In the above manner, the error caused by the power supply circuit 3 and the current voltage conversion circuit 4 and the error of the offset and gain in the programmable comparators 16 are compensated, and the correct results of comparison are obtained at terminal Tc.

Here, the calculator 13 carried out correction calculation according to the digital code sent from the test controller 11 as follows:

(a) if the digital code from the test controller 11>0, then $$\text{the corrected digital code} = \text{the gain correction } A \times \text{the digital code from the test controller } 11 + \text{offset digital code} \quad (6)$$

(b) if the digital code from the test controller 11<=0, then $$\text{the corrected digital code} = \text{gain correction } B \times \text{the digital code from the test controller } 11 + \text{offset digital code} \quad (7)$$

In these two equations, the point on straight line Q shown in FIG. 3 as the ideal characteristics is converted to the point on the straight line (that is, the straight line showing the actual circuit characteristics) connecting point "a" and point "b", or point "a" and point "c".

Moreover, in the above embodiment, the measurement points of the supplied current value are the three points "largest positive supplied current", "0", and "largest negative supplied current", but more than one supplied current value other than these can be used. In doing so, a more realistic relation between the supplied current value and the digital code can be obtained, a correction calculation with an even higher precision can be carried out, allowing the realization of an even higher precision calibration.

In addition, if a negative electric current value is unnecessary as the current value supplied to the power supply point Ps, the measurement point of the electric current value of the "largest positive supplied current" and "0" can be used. In the same manner, if a positive current value is unnecessary as a supplied electric current value, the "largest negative supplied current" and "0" can be used. In addition, in these cases as well, more measurement points of the electric current value can be provided.

In addition, in the above-described embodiment, the test controller 11 and the calculator 13 operate in parallel, but a structure in which the function of the calculator 13 is incorporated into for the test controller 11 itself, and the calculator 13 omitted is possible, and furthermore, a structure wherein the memory 14 is built into the test controller 11 is also possible.

Finally, an embodiment wherein a switching circuit 19 is not provided and the set of the resistors 17 and the DMM 18 are provided in only identical numbers to the power supply point Ps is within the scope of the present invention.

What is claimed is:

1. A calibration apparatus for a programmable comparator which compares an analog voltage value corresponding to a supplied digital code and the voltage value corresponding to an electric current value of an electric current supplied by a predetermined power supply point, provided with:

a power supply means which supplies electric current of an indicated electric current value to said power supply point;

an electric current detection means which converts the electric current value of an electric current flowing through said power supply point to a voltage value, and outputs the same to said programmable comparator;

a calculation means which generates an electric current for each supplied current value of "0" and predetermined electric current value other than "0" in said power supply means, calculates the digital code which generates the result of said comparison that shows agreement with both of said voltage values as the actually measured digital code for each of said supplied current values, and calculates code correction data from the ideal characteristics between the supplied current value and the digital code, and each of said supplied current values and each of said actually measured digital codes corresponding to them; and a correction means which corrects the digital code supplied to said programmable comparator based on said calculated code correction data.

2. A calibration apparatus for a programmable comparator according to claim 1 wherein:

said calculation means calculates said actually measured digital code corresponding to the supplied current value of said "0" as the offset correction data, and at the same time calculates gain correction data from said actually measured digital code corresponding to each of said supplied current values and said ideal characteristics; and said correction means uses said offset correction data and said gain correction data as said code correction data.

3. A calibration apparatus for a programmable comparator according to claim 2 wherein said calculation means calculates said gain correction data from the slope of said ideal characteristics in a graph showing the relationship between the supplied current value and the digital code, and the slope of the straight line connecting each of said actually measured digital codes.

4. A calibration apparatus for a programmable comparator according to claim 1 wherein said calculation means, while changing the digital code sent to said programmable comparator, determines the digital code of the border when the size relationship showing said results of comparison reverses as said actually measured digital code.

5. A calibration apparatus for a programmable comparator according to claim 1 wherein said predetermined current value is one or more electric current values selected within a range between the largest positive current value and the largest negative current value which said power supply means can supply.

6. A calibration apparatus for a programmable comparator according to claim 5 wherein said predetermined current value is said largest positive current value and said largest negative current value.

7. A calibration apparatus for a programmable comparator according to claim 1 wherein said predetermined current value is one or more electric current values selected within a range between the largest positive current value which said power supply means can supply and "0".

8. A calibration apparatus for a programmable comparator according to claim 1 wherein said predetermined current value is one or more electric current values selected within a range between "0" and the largest negative current value which said power supply means can supply.

9. A calibration apparatus for a programmable comparator according to claim 1 further provided with:

an electric current value measuring means which measures the electric current value flowing through said power supply point; and an adjustment means which, while varying electric current value indicated to said power supply means for the supplied current value of at least "0", adjusts said electric current value measured by said electric current value measuring means to said supplied current value.

10. A calibration apparatus for a programmable comparator according to claim 9 wherein said electric current value measuring means is provided with a resistor connected between said power supply point and a ground and a digital multimeter which measures the terminal voltage of said resistor.

11. A calibration apparatus for a programmable comparator according to claim 9 provided with:

a plurality of said power supply points; and a switching means which selects one from among said plurality of power supply points, and connects the selected power supply point to said electric current value measuring means.

12. A calibration apparatus for a programmable comparator according to claim 1 further provided with:

a plurality of said power supply points;

a plurality of sets of said programmable comparator, said power supply means, and said electric current detection means corresponding to each of said plurality of said power supply points, and a selection means which selects a set as the object of calibration from among the plurality of said sets.

* * * * *